United States Patent [19]

Chernicky et al.

[11] Patent Number: 5,435,733
[45] Date of Patent: Jul. 25, 1995

[54] CONNECTOR ASSEMBLY FOR MICROELECTRONIC MULTI-CHIP-MODULE

[75] Inventors: Gerald P. Chernicky, Fountain Valley; Christopher M. Schreiber, Lake Elsinore; Alan L. Kovacs, Long Beach; Bao Q. Le, Santa Ana; Haim Feigenbaum, Irvine, all of Calif.

[73] Assignee: Hughes Aircraft Company, Los Angeles, Calif.

[21] Appl. No.: 152,342

[22] Filed: Nov. 12, 1993

[51] Int. Cl.⁶ .............................................. H01L 21/60
[52] U.S. Cl. ........................................ 439/68; 439/71; 361/785; 324/762
[58] Field of Search ...................... 439/67, 68, 71, 77, 439/66; 361/785, 788; 324/762

[56] References Cited

U.S. PATENT DOCUMENTS

| | | | |
|---|---|---|---|
| Re. 31,114 | 12/1982 | Berg | 439/71 |
| 3,924,915 | 12/1975 | Conrad | 361/785 |
| 4,125,310 | 11/1978 | Reardon, II et al. | 339/92 M |
| 4,164,003 | 8/1979 | Cutchaw | 439/67 |
| 4,194,800 | 3/1980 | Chow | 439/71 |
| 4,453,795 | 6/1984 | Moulin | 339/92 M |
| 4,878,846 | 11/1989 | Schroeder | 439/68 |
| 5,059,898 | 10/1991 | Barsotti et al. | 324/762 |
| 5,104,327 | 4/1992 | Walburn | 439/77 X |
| 5,194,698 | 3/1993 | Souto et al. | 174/255 |
| 5,197,184 | 3/1993 | Crumly et al. | 174/251 X |
| 5,207,887 | 5/1993 | Crumly et al. | 205/78 |
| 5,245,135 | 9/1993 | Schreiber et al. | 174/264 |
| 5,309,324 | 5/1994 | Herandez et al. | 361/785 |

OTHER PUBLICATIONS

L. Palmieri, "Performance Characterization of VAX 9000 MCU Flexible Circuit Interconnect", *Circuit World*, vol. 18, No. 3, 1992 (date, page nos. unknown).

*Primary Examiner*—Kenneth J. Ramsey
*Attorney, Agent, or Firm*—Elizabeth E. Leitereg; Terje Gudmestad; W. K. Denson-Low

[57] ABSTRACT

A Multi-Chip-Module or MCM (66) is mounted on a supporting motherboard (64). A plurality of first contact pads (99) are formed on the module (66) adjacent to its peripheral edge for interconnection with microelectronic components (70,72,74,76,78) mounted on the module (66). Second contact pads (94) are formed on the motherboard (64) adjacent to respective first contact pads (99). A flexible cable (96) includes controlled impedance microstrip or stripline conductor (98) with first and second gold dots (100,102) at their ends. A frame (104) resiliently presses the first and second gold dots (100, 102) into connection with respective first and second contacts (99,94) for interconnection thereof. The components (70, 72,74,76,78) on the module (66) can be hermetically sealed by a cover (80), and the module (66) and cable (96) can be hermetically sealed by a first resilient ring (112) which is compressed between the frame (104) and the cover (80), and a second resilient ring (114) which is compressed between the frame (104) and the motherboard (64). Alternatively, the cover (80) and the first ring (112) can be replaced by a cover (104a) which is integral with a frame (104'). An alternative connector (136) includes a flexible cable (146) which extends around an edge of a frame (144) to enable vertical stacking of MCMs (164) and/or backplanes (138) in any combination.

20 Claims, 7 Drawing Sheets

CONNECTOR ASSEMBLY FOR MICROELECTRONIC MULTI-CHIP-MODULE

BACKGROUND OF THE INVENTION

1. Field of the Invention

The present invention generally relates to the art of microelectronics, and more specifically to a connector assembly for interconnecting a Multi-Chip-Module (MCM) microelectronic circuit and a motherboard or other supporting member.

2. Description of the Related Art

An MCM, also known as a High-Density-Multichip-Interconnect (HDMI), is a microelectronic circuit structure which integrates a supporting substrate with metallization patterns for power and signal interconnects. A conventional MCM includes a substrate on which one or more integrated microcircuit chips are mounted, and a multilevel structure including alternating patterned metal conductor metallization and dielectric layers for interconnecting the chips and providing external connections.

Figure 1:
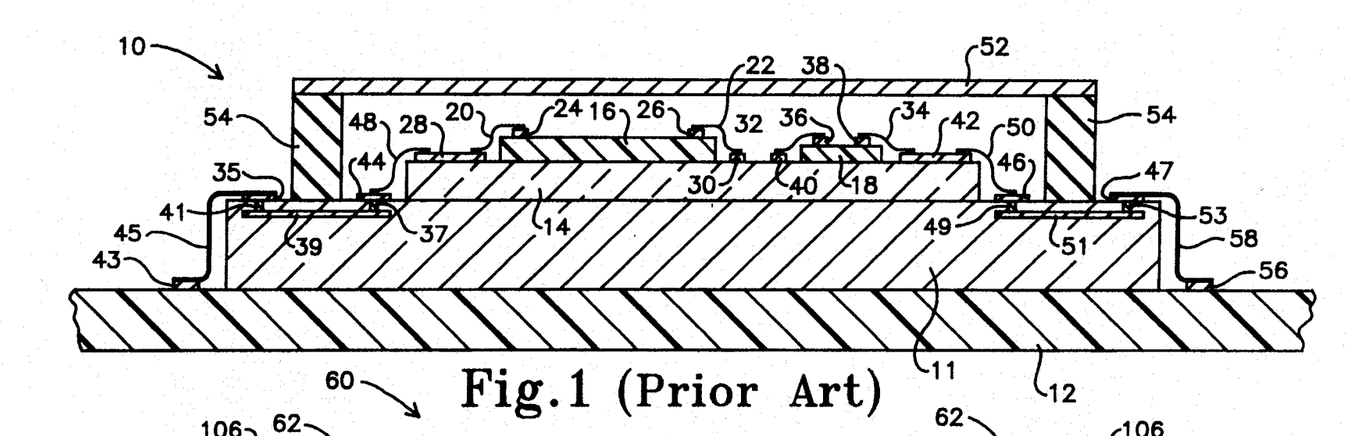
FIG. 1 is a simplified cross-sectional view illustrating a prior art electronic assembly including a Multi-Chip-Module (MCM) and a motherboard on which the module is mounted.

A conventional method of interconnecting a packaged MCM module 10 with a supporting Printed-Wiring-Board (PWB) or motherboard 12 on which it is mounted is illustrated in FIG. 1. The module 10 typically includes a package 11 and an integrally attached substrate 14 which is in turn adhesively adhered and soldered to the motherboard 12, and microelectronic integrated circuit chips and/or other components 16 and 18 which are mounted on the substrate 14.

Although not specifically illustrated, the substrate 14 includes an arrangement of buried metallizations and vertical interconnects for providing interconnection between the components 16 and 18. Gold or aluminum leads or wirebonds 20 and 22 are illustrated as connecting bonding or contact pads 24 and 26 on the component 16 to bonding or contact pads 28 and 30 on the substrate 14.

Gold or aluminum leads or wirebonds 32 and 34 are illustrated as interconnecting contact pads 36 and 38 on the component 18 with interconnect pads 40 and 42 on the substrate 14. The interconnect pads 28 and 42 are connected to contact pads 44 and 46 on the package 11 by wirebonds 48 and 50 respectively. Alternatively, flip-chip interconnects (not shown) could also be used for the components 16 and 18.

The contact pad 44 is connected to a contact pad 35 through a vertical interconnect or via 37, a buried refractory metal interconnect 39 and a via 41. The contact pad 46 is connected to a contact pad 47 through a via 49, a buried refractory metal interconnect 51 and a via 53. The contact pads 35 and 47 are connected to contact pads 43 and 56 on the motherboard 12 by Kovar, package leads or interconnects 45 and 58 respectively. The interconnects 39 and 51 extend under a sealing ring 54 on which a metal cover 52 is mounted for environmentally sealing the components 16 and 18 and associated metallization and leads.

The Kovar interconnects 45 and 58 are typically brazed to the contact pads 35 and 47 on the package 11, and soldered to the contact pads 43 and 56 on the motherboard 12 respectively. Although only two sets of contact pads 35,43 and 47,56 and package interconnects 45,58 are shown in the drawing, an actual MCM will include a large number of contact pads and interconnects which are closely spaced about the periphery of the package 11.

Brazing the Kovar leads 45 and 58 to the contact pads 35 and 47 is an extremely delicate and precise mechanical operation. The interconnects 45 and 58 are fragile, and are easily damaged during fabrication, assembly, lead forming and electrical testing. The interconnects 45 and 58 are also subject to fatigue failure caused by random vibration.

Removal of a malfunctioning module 10 from the motherboard 12 is extremely difficult since all of the interconnects 45 and 58 must be desoldered, the package 11 removed, and a replacement module mounted and interconnected. Consequently, the module cost can be very high due to the difficulties associated with the high lead count package 11.

Another drawback of the conventional arrangement illustrated in FIG. 1 is that the package interconnects 45 and 58 have inductance and bends of indeterminate shape which cause reflection of electrical signals and make it difficult to control the impedance of the interconnects 45 and 58 to a desired value. The bends cause delays in signal propagation through the interconnects 45 and 58 and contact pads 35,43 and 47,56, thereby limiting the operating speed of the components 16 and 18 and associated components on the motherboard 12.

SUMMARY OF THE INVENTION

In an electronic assembly embodying the present invention, a Multi-Chip-Module (MCM) is mounted on a supporting motherboard. A large number of first contact pads are formed on the module adjacent to its peripheral edge for interconnection with microelectronic components mounted on the module.

Second contact pads are formed on the motherboard adjacent to respective first contact pads. A flexible cable includes controlled impedance microstrip or stripline conductors with first and second rigid gold dots at their ends. A frame resiliently presses the first and second gold dots into connection with respective first and second contacts for interconnection thereof.

In order to reduce the cost of the module, a package with Kovar leads is eliminated. The components on the module can be sealed by utilizing a hermetic cover, or by encapsulating the components in a silicone or polymer gel, then the cover need not be fully hermetic. The module and flex cable are environmentally sealed by a first resilient ring which is compressed between the frame and the cover, and a second resilient ring which is compressed between the frame and the motherboard. Alternately, the cover and the first ring can be replaced by a cover which is integral with the frame.

The present interconnect design eliminates the need for fine pitch Kovar leads to be brazed to the module, thereby simplifying construction and reducing cost. Damage to the delicate package leads during fabrication, assembly, lead forming and testing is eliminated. Mechanical mounting and thermal interface issues are greatly simplified.

Lead fatigue and failure due to random vibration are eliminated. Removal of failed modules is also greatly simplified, enabling easy rework of expensive modules. Electrical speed is increased because inductive wirebonds having bends of indeterminate shape are replaced by controlled impedance flexible cable with gold dot connections.

Crosstalk is also reduced with this design. Expensive, custom electrical sockets are not required for testing as with the conventional arrangement, thereby simplifying electrical test operations. Burn-in operations are also simplified due to the high temperature durability of the flexible cable connector. These advantages in combination substantially reduce the cost of fabricating MCM assemblies, enabling higher yields and faster assembly and testing times.

In an alternative embodiment of the invention, a connector includes a flexible cable which extends around the edge of a frame to interconnect an MCM and another MCM or a backplane on opposite sides of the frame. This enables vertical stacking of MCMs, backplanes and/or motherboards in any combination.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
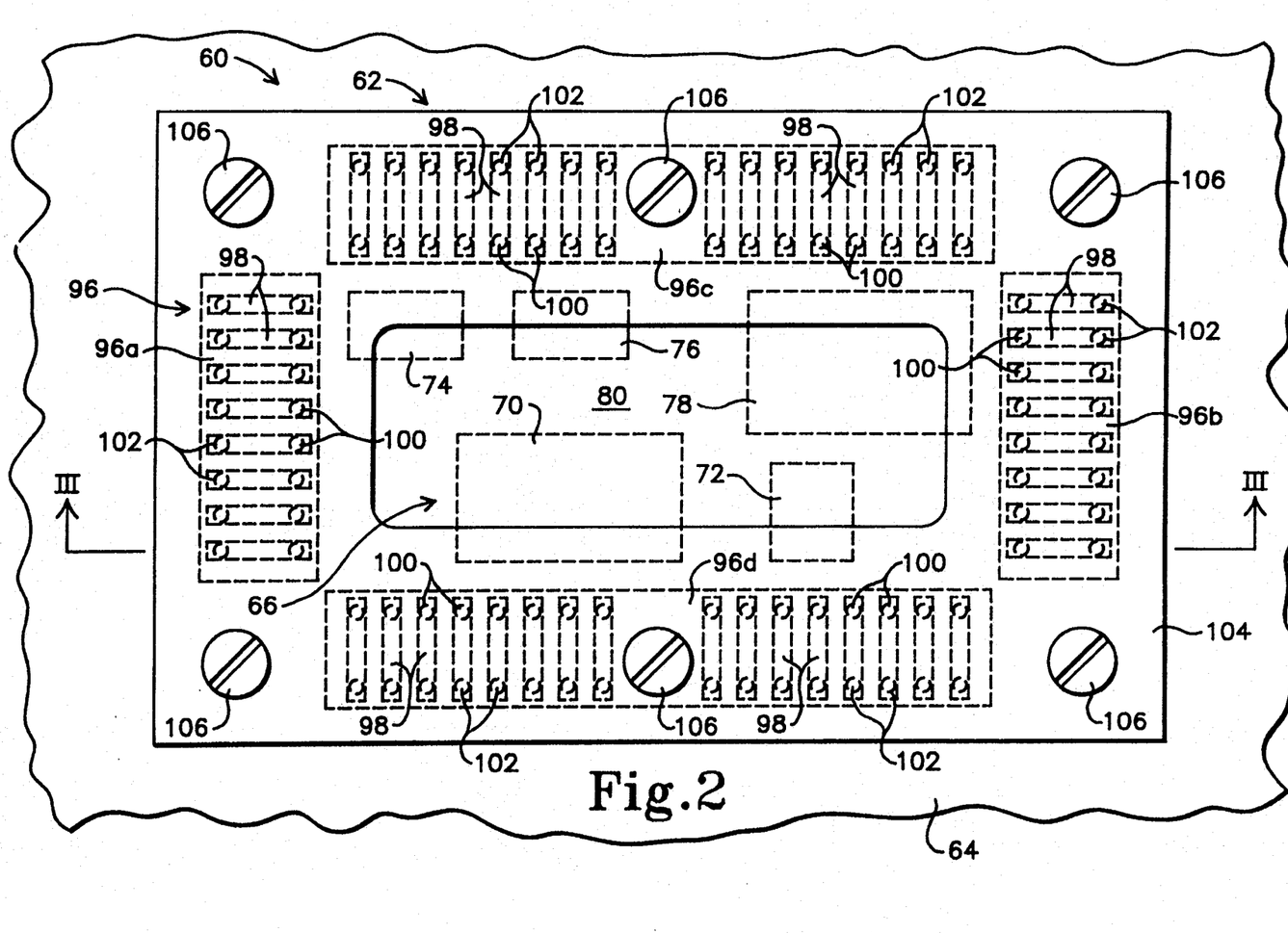
FIG. 2 is a simplified plan view illustrating an electronic assembly including an MCM module and a motherboard embodying the present invention.
Figure 3:
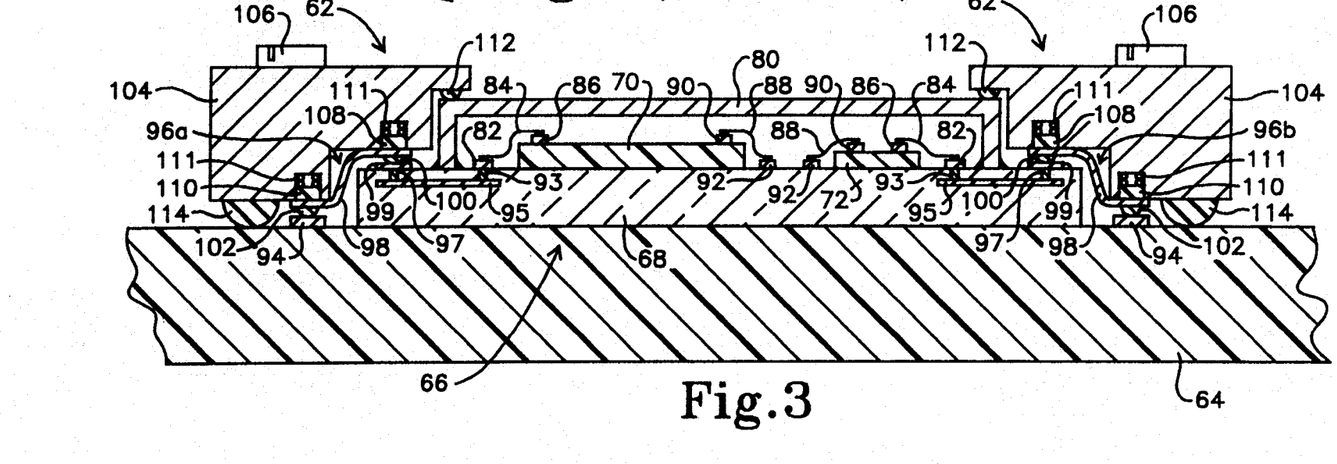
FIG. 3 is a section take on a line III—III of FIG. 2.
Figure 4:
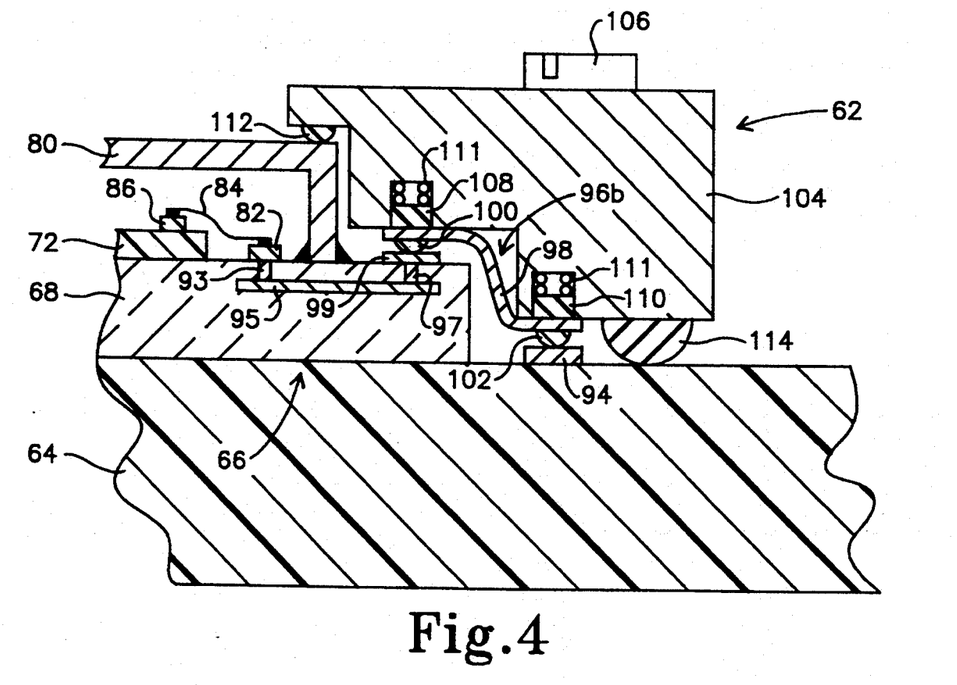
FIG. 4 is a fragmentary sectional view, to enlarged scale, of the assembly of FIGS. 2 and 3.

An electronic assembly 60 including a connector assembly 62 embodying the present invention is illustrated in FIGS. 2 to 4. The electronic assembly 60 includes a support member such as a printed wiring board (PWB) or motherboard 64 on which a Multi-Chip-Module (MCM) microelectronic circuit structure 66 is mounted.

The module 66 shown includes an alternate substrate/package configuration 68, and an exemplary set of microelectronic integrated circuit chips and/or other components 70, 72, 74, 76 and 78 which are mounted on the substrate 68 and hermetically sealed by a cover 80. The protective cover 80 can be a structural member which spans, but does not contact the components 70, 72, 74, 76 and 78 as illustrated, or can be an epoxy resin or other encapsulation in which the components 70, 72, 74, 76 and 78 are buried.

Contact pads, which are collectively designated as 82, are formed on the substrate 68 adjacent to its peripheral edge. Although only a few contact pads 82 are illustrated in the drawing for simplicity of illustration, in an actual application a large number of contact pads 82 will be provided which are spaced from each other by a small distance or pitch.

The contact pads 82 are connected through vias 93, buried metal interconnects 95 and vias 97 to first contact pads 99. Wirebonds 84 are illustrated as connecting contact pads 86 on the components 70 and 72 (and also on the components 74, 76 and 78 although not visible in the drawings) to the contact pads 82. Wirebonds 88 similarly connect contact pads 90 on the components 70, 72, 74, 76 and 78 to contact pads 92 on the substrate 68.

Second contact pads which are collectively designated as 94 are formed on the motherboard 64 adjacent to respective first contact pads 99. The first and second contact pads 99 and 94 are interconnected by a controlled impedance, flexible cable 96 which can be continuous or, as illustrated in FIG. 2, consist of sections 96a, 96b, 96c and 96d.

The cable 96 is made of a flexible Kapton, or other comparable material, and includes a plurality of flexible microstrip or stripline conductors 98, each of which interconnects a set of contact pads 99, 94 respectively. A first protrusion, preferably a gold button or dot 100, is formed at the radially inner end of each interconnect conductor 98, and a similar second protrusion or gold dot 100 is formed at the radially outer end of each conductor 98.

The gold dots 100 and 102 may be configured as disclosed in U.S. Pat. No. 5,197,184, issued Mar. 30, 1993 and U.S. Pat. No. 5,207,887, issued May 4, 1993, both assigned to Hughes Aircraft Company.

In accordance with the present invention, a frame 104 presses the first dots 100 into electrical connection with the first contact pads 99, and presses the second dots 102 into electrical connection with the second contact pads 94. The contact pads 99 on the module 66 are thereby connected to the contact pads 94 on the motherboard 64 through the respective conductors 98 and gold dots 100 and 102. The frame 104 is clamped to the motherboard 64 by bolts 106 or the like.

The frame 104 is made of aluminum/silicon/carbide or other material which has the required stiffness and weight characteristics. Elastomer blocks 108 and 110 of Viton, rubber or other suitable resilient material are retained in cavities in the frame 104 and resiliently apply forces to the gold dots 100 and 102 to press them against the contact pads 99 and 94 respectively.

Compression springs 111 can be provided for exerting forces on the blocks 108 and 110 and thereby increasing the contact forces between the dots 100 and 102 and the contact pads 99 and 94. The ends of the blocks 108 and 110 which engage with the cable 96 preferably have a convex shape for optimally distributing the forces applied to the dots 100 and 102 and enhancing the contact effectiveness.

As described in the above referenced U.S. patents, the flexible substrate and the elastomer behind it allow the dots 100 and 102 to compensate for irregularities in the interface with the contact pads 99 and 94 to provide efficient ohmic contact. The arrangement of the conductors 98 and dots 100 and 102 does not include bends of indeterminate shape which would cause reflection of electrical signals and introduce signal propagation delays. The present invention thereby provides a controlled impedance design with substantially higher electrical operating speed than is possible with the prior art.

The radially inner portion of the frame 80 is cut away. A resilient first sealing ring 112 made of a chemically impervious material is sealingly compressed between the frame 104 adjacent to its inner peripheral edge and the cover 80. A similar second sealing ring 114 is sealingly compressed between the radially outer portions of the frame 104 and the motherboard 64. The cable 96, the first contacts 99 and the second contacts 94 are hermetically sealed between the rings 112 and 114 and therefore protected from mechanical damage and environmental contamination.

Figure 5:
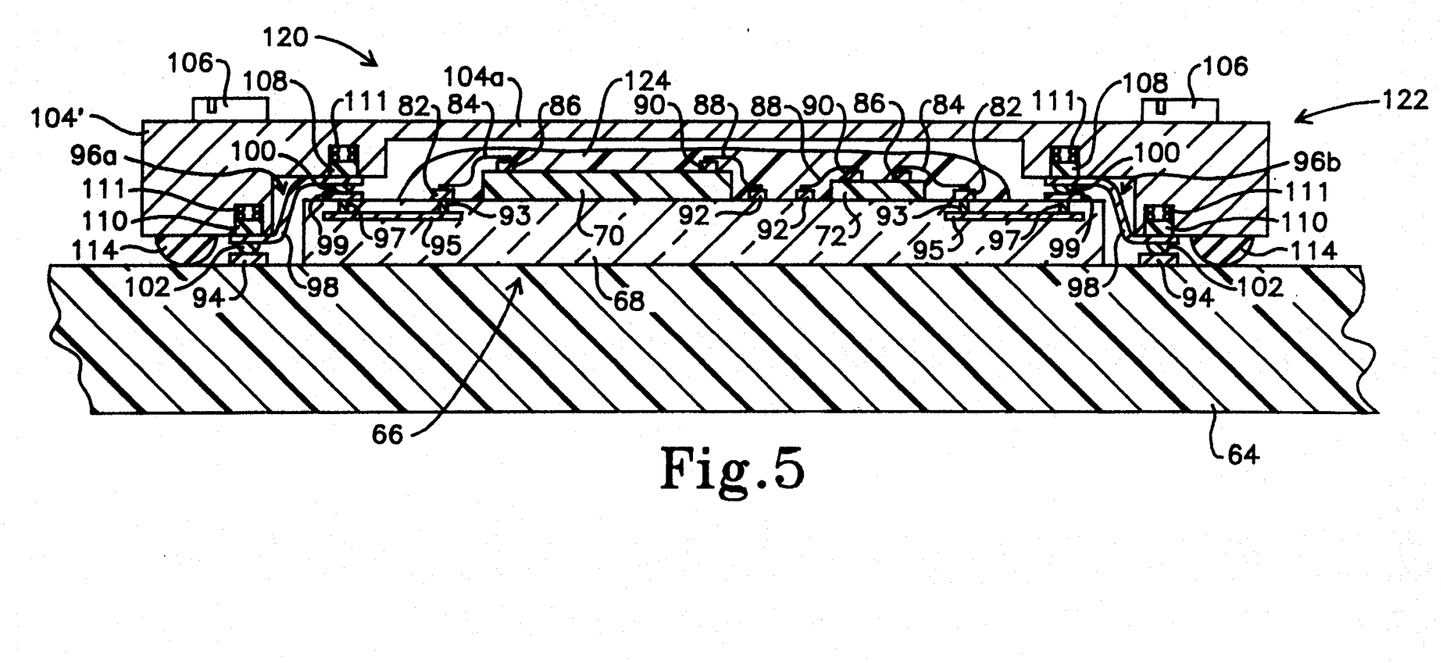
FIG. 5 is a section view illustrating another electronic assembly embodying the present invention using an integral cover.
Figure 6:
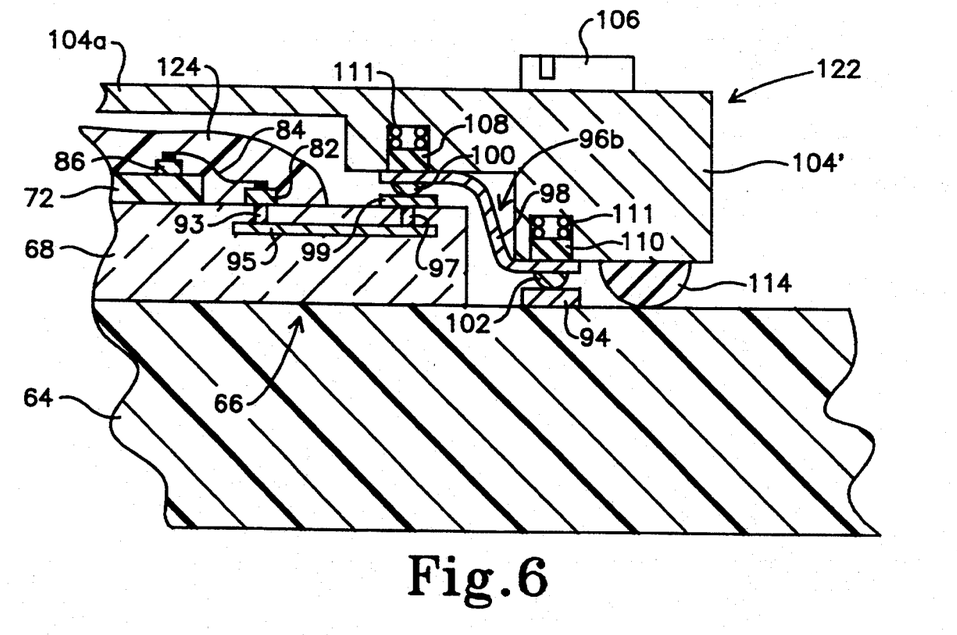
FIG. 6 is a fragmentary sectional view, to enlarge scale, of the assembly of FIG. 5.

FIGS. 5 and 6 illustrate another electronic assembly 120 embodying the present invention which includes a connector assembly 122. The assembly 120 differs from the assembly 60 in that the cover 80 is omitted and the components 70, 72, 74, 76 and 78 and wirebonds 84 and 88 are encapsulated in a silicone or polymer gel or encapsulant 124. The first sealing ring 112 is also omitted.

A modified frame 104' includes an integral cover 104a which replaces the inner cutout of the frame 104. The cover 104a performs the function of the cover 80 and the first sealing ring 112. The cable 96, module 66 and contact 99 and 94 are therefore hermetically sealed by the frame 104' and the second sealing ring 114. The arrangement of FIGS. 5 and 6 is especially suitable for applications such as low cost computers including MCM modules which are populated and encapsulated (passivated), but are not provided with standard packages including covers.

Whereas the MCMs are mounted directly on motherboards in the embodiments of the invention illustrated in FIGS. 2 to 6, FIGS. 7 to 10 illustrate how an alternative connector embodying the invention can include a flexible cable which extends around the edge of a frame to interconnect an MCM and another MCM, motherboard or backplane which is disposed on an opposite side of the frame from the first MCM. This concept can be extended to stack an unlimited number of MCMs and/or backplanes.

Figure 7:
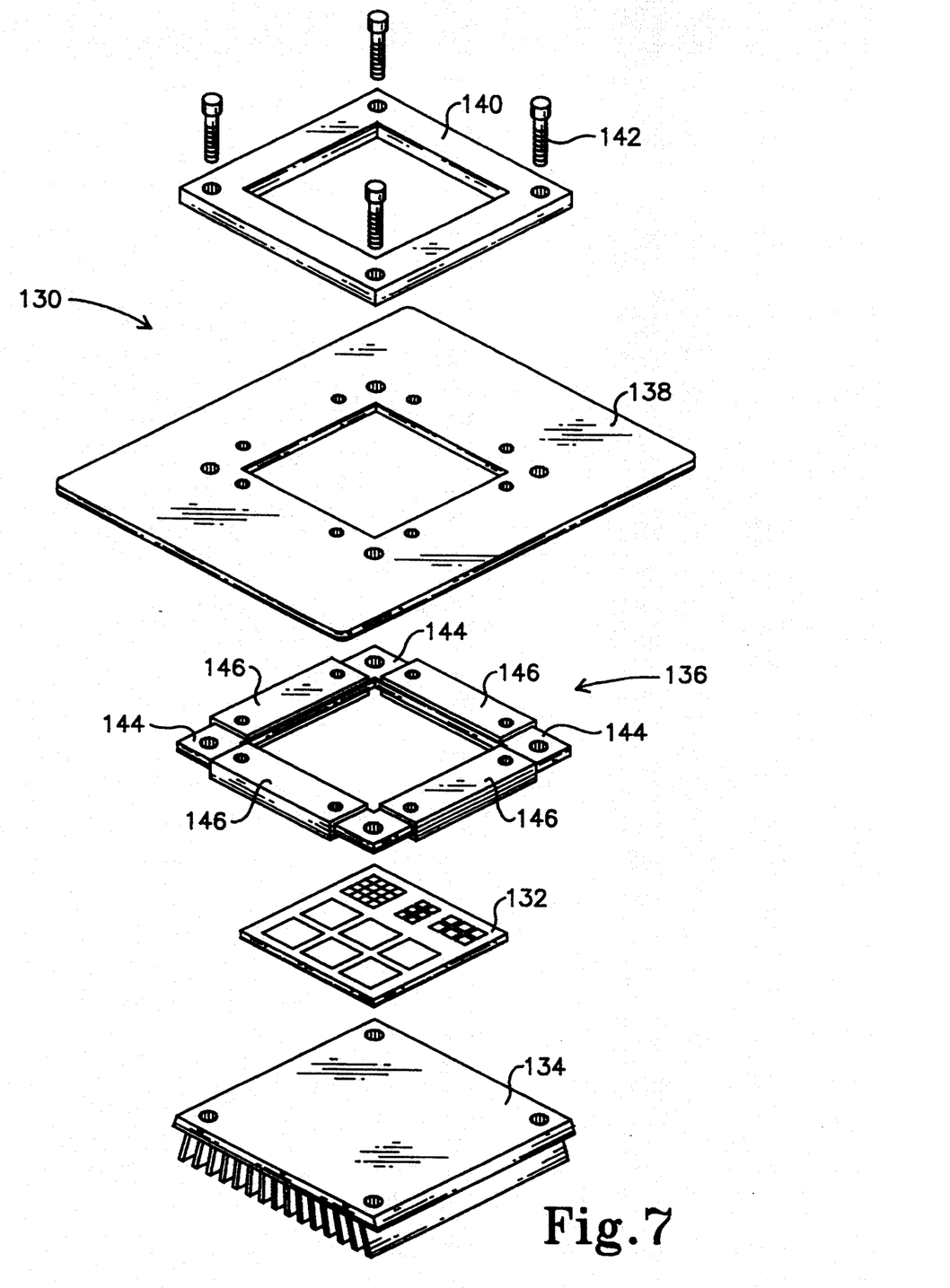
FIG. 7 is an exploded view illustrating another electronic assembly embodying the invention including a frame and a flexible gold dot cable assembly which extends around an end of the frame for interconnecting an MCM and a backplane.
Figures 8, 9:
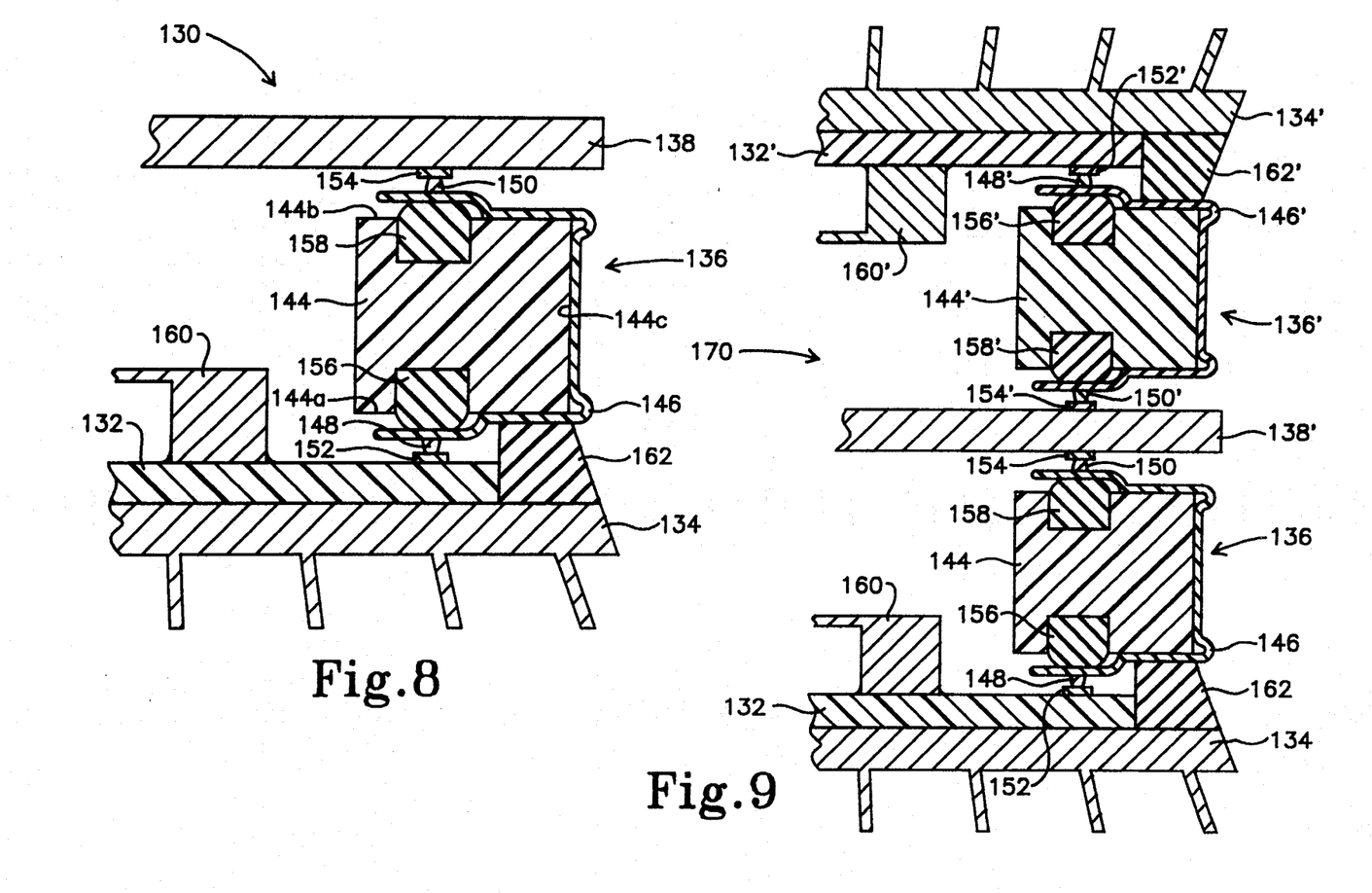
FIG. 8 is a fragmentary sectional view illustrating an edge portion of the assembly of FIG. 7.
FIG. 9 is a fragmentary sectional view illustrating how the concept of FIGS. 7 and 8 can be extended to interconnect two MCMs to opposite sides of a backplane.

FIGS. 7 and 8 illustrate an electronic assembly 130 including an MCM 132 which is mounted on a heat sink 134 by an adhesive (not shown). A cut-out rectangular connector 136 is disposed between the MCM 132 and a backplane 138 which is formed with interconnect metallizations (not shown) and serves a function similar to the motherboard 64 described above. The heat sink 134, MCM 132, connector 136 and backplane 138 are pressed together by a metal stiffener 140 and bolts 142.

As best seen in FIG. 8, the connector 136 includes a frame 144 having a first surface 144a which faces the MCM 132 and a second surface 144b which faces the backplane 138. The frame 144 is preferably made of polyimide reinforced with Arlon, Kevlar, or glass fibers. A flexible cable 146 which is essentially similar to the cable 96 described above extends around an end 144c of the frame 144.

The cable 146 includes conductors (not shown) which terminate at their ends in first and second gold dots 148 and 150 which extend away from the surfaces 144a and 144b of the frame 144 respectively. The dots 148 and 150 are pressed into ohmic connection with contact pads 152 and 154 formed on the MCM 132 and backplane 138 by elastomer blocks 156 and 158 respectively. Further illustrated are a cover 160 for enclosing the microelectronic components (not designated) on the MCM 132, and a resilient seal member 162 disposed between heat sink 134 and the connector 136 for sealing the peripheral edge of the assembly 130.

The concept of FIGS. 7 and 8 enables vertical stacking of MCMs and backplanes. As illustrated in FIG. 9, two MCMs can be connected to the opposite sides of one backplane. An electronic structure 170 includes the MCM 132, the heat sink 134 and the connector 136 of FIG. 8. A modified backplane 138' further includes contacts 154' formed on a surface opposite the surface on which the contacts 154 are formed. A second MCM 132' including contacts 152' and a second heat sink 134' are connected to the backplane 138' by a second connector 136' in a manner identical to that described with reference to FIG. 8.

Figure 10:
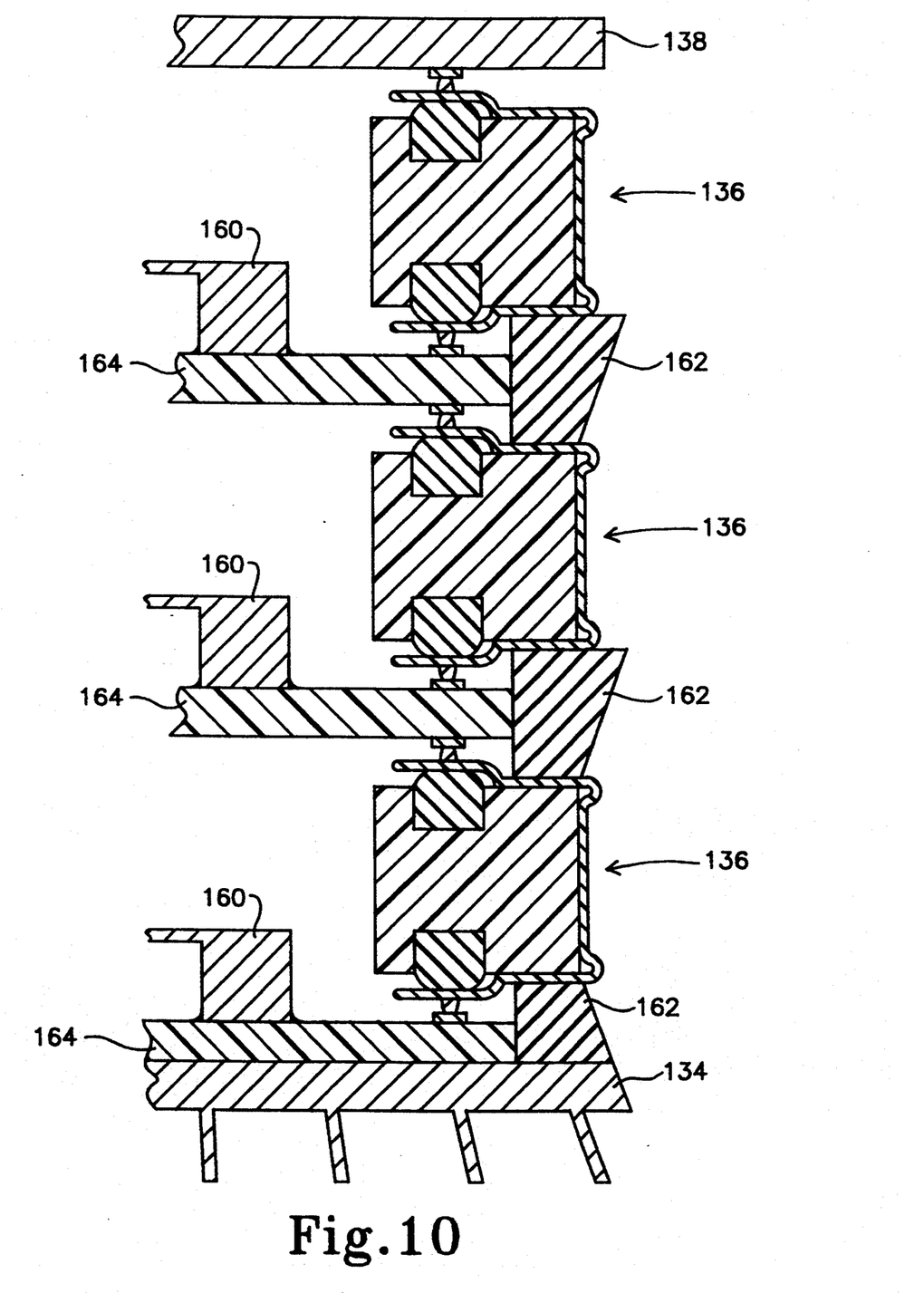
FIG. 10 is a fragmentary sectional view illustrating how the concept of FIGS. 7 and 8 can be extended to interconnect a stack of MCMs.

FIG. 10 illustrates how an unlimited number of MCMs can be vertically stacked between the heat sink 134 and the backplane 138 using a plurality of connectors 136. MCMs 164 are similar to the MCM 132 except that they have contacts (not designated) on both surfaces thereof which are pressed into ohmic contact with the gold dots of the connectors 136.

It will be understood that the present arrangement of interconnecting an MCM and another MCM or a backplane disposed on opposite sides of the connector 136 can be extended to include vertical stacking of MCMs, backplanes and/or motherboards in any combination.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A connector assembly for electrically connecting a first contact on a microelectronic structure to a second contact on a support member, comprising:
   a flexible cable including first and second spaced protrusions;
   a frame for resiliently pressing the first and second protrusions into electrical connection with the first and second contacts respectively;
   a first resilient sealing member sealingly compressed between the frame and the microelectronic structure; and
   a second resilient sealing member sealing compressed between the frame and the support member, said first and second resilient members for hermetically sealing the first contact, the second contact and the cable.

2. A connector assembly as in claim 1, in which the first and second protrusions comprise gold dots.

3. A connector assembly as in claim 1, in which the microelectronic structure is hermetically sealed with a cover and
   the first resilient sealing member is sealingly compressed between the frame and the cover.

4. A connector assembly as in claim 1, further comprising resilient means which are retained by the frame for resiliently pressing the first and second protrusions into electrical connection with the first and second contacts respectively.

5. The connector assembly as in claim 4, in which the resilient means comprise first and second elastomer blocks.

6. A connector assembly as in claim 5, in which the elastomer blocks have convex ends which resiliently press the first and second protrusions into electrical connection with the first and second contacts respectively.

7. The connector assembly as in claim 5, in which the resilient means further comprise first and second springs retained by the frame adjacent to respective first and second elastomer blocks.

8. A connector assembly as in claim 1, in which the flexible cable comprises a conductor having a controlled impedance strip-line which electrically interconnects the first and second protrusions.

9. A connector as in claim 1, in which the microelectronic structure is mounted on the support member.

10. A connector as in claim 1, in which:
the frame has first and second opposite surfaces;
the flexible cable extends around an edge of the frame such that the first protrusion extends away from said first surface and the second protrusion extends away from said second surface;
the microelectronic structure faces said first surface of the frame with the first protrusion being pressed into electrical connection with the first contact; and
the support member faces said second surface of the frame with the second protrusion being pressed into electrical connection with the second contact.

11. An electronic assembly, comprising:
a microelectronic structure including a substrate, and a microelectronic component mounted on the substrate;
a support member;
a plurality of first contacts provided on the substrate adjacent to a peripheral edge thereof for interconnection with the microelectronic component;
a plurality of second contacts provided on the support member adjacent to the first contacts respectively;
a flexible cable including a plurality of electrical interconnects for connecting first contacts to second contacts respectively, each interconnect including an elongated electrical conductor and first and second spaced protrusions;
a frame for pressing the first and second protrusions into electrical connection with the first and second contacts respectively;
a first resilient ring which is sealingly compressed between the frame and the substrate; and
a second resilient ring which is sealingly compressed between the frame and the support member, the first and second resilient rings for hermetically sealing the first contact, the second contact and the cable.

12. As assembly as in claim 11, in which the first and second protrusions comprise gold dots.

13. An assembly as in claim 11, in which:
the microelectronic structure further comprises a cover which is attached to the substrate and hermetically seals the microelectronic component; and
the first resilient ring is sealingly compressed between the frame and the cover.

14. An assembly as in claim 11, in which the frame comprises a cover which encloses the microelectronic component.

15. An assembly as in claim 11, further comprising resilient means which are retained by the frame for resiliently pressing the first and second protrusions into electrical connection with the first and second contacts respectively.

16. An assembly as in claim 15, in which the resilient means comprise first and second elastomer blocks.

17. An electronic assembly as in claim 16, in which the elastomer blocks have convex ends which resiliently press the first and second protrusions into electrical connection with the first and second contacts respectively.

18. An assembly as in claim 16, in which the resilient means further comprise first and second springs retained by the frame adjacent to respective first and second elastomer blocks.

19. An assembly as in claim 11, in which each conductor comprises a controlled impedance stripline which electrically interconnects the first and second protrusions.

20. An assembly as in claim 11, in which:
the frame has first and second opposite surfaces;
the flexible cable extends around an edge of the frame such that the first protrusions extend away from said first surface and the second protrusions extend away from said second surface;
the microelectronic structure faces said first surface of the frame with the first protrusions being pressed into electrical connection with the first contacts; and
the support member faces said second surface of the frame with the second protrusions being pressed into electrical connection with the second contacts.

* * * * *